US011662414B2

(12) United States Patent
Benkert et al.

(10) Patent No.: US 11,662,414 B2
(45) Date of Patent: May 30, 2023

(54) TRAINED IMAGE PROCESSING FOR DIFFUSION WEIGHTED IMAGING AND/OR TURBO SPIN ECHO SEQUENCES WITH FOCUS ON BODY APPLICATIONS

(71) Applicant: Siemens Healthcare GmbH, Erlangen (DE)

(72) Inventors: Thomas Benkert, Uttenreuth (DE); Robert Grimm, Nuremberg (DE); Berthold Kiefer, Erlangen (DE); Marcel Dominik Nickel, Herzogenaurach (DE)

(73) Assignee: Siemens Healthcare GmbH, Erlangen (DE)

( * ) Notice: Subject to any disclaimer, the term of this patent is extended or adjusted under 35 U.S.C. 154(b) by 427 days.

(21) Appl. No.: 17/038,398

(22) Filed: Sep. 30, 2020

(65) Prior Publication Data

US 2021/0096204 A1    Apr. 1, 2021

(30) Foreign Application Priority Data

Sep. 30, 2019  (EP) .................................. 19200571

(51) Int. Cl.
| | | |
|---|---|---|
| *G01R 33/56* | (2006.01) | |
| *G01R 33/561* | (2006.01) | |
| *G01R 33/563* | (2006.01) | |
| *G06N 3/063* | (2023.01) | |
| *G06N 3/084* | (2023.01) | |
| *G06V 10/75* | (2022.01) | |

(52) U.S. Cl.
CPC ... *G01R 33/5615* (2013.01); *G01R 33/56341* (2013.01); *G06N 3/063* (2013.01); *G06N 3/084* (2013.01); *G06V 10/751* (2022.01)

(58) Field of Classification Search
CPC ............. G01R 33/543; G01R 33/5608; G01R 33/4828; G01R 33/3415; G01R 33/283; G01R 33/307; G01R 33/60; G01R 33/5615; G01R 33/56341; G01V 3/32; E21B 49/08; E21B 2049/085; G01N 24/10; G06V 10/751; G06N 3/063; G06N 3/084

See application file for complete search history.

(56) References Cited

U.S. PATENT DOCUMENTS

2016/0363643 A1*  12/2016  Umeda ............... G01R 33/4824
2018/0098712 A1*  4/2018  Chen ................... G01R 33/5615

FOREIGN PATENT DOCUMENTS

WO      2019178133 A1    9/2019

OTHER PUBLICATIONS

Lyu, Qing et al. "Super-resolution MRI through Deep Learning" arXiv:1810.06776, Oct. 2018 // https://arxiv.org/abs/1810.06776.
(Continued)

*Primary Examiner* — Jermele M Hollington
*Assistant Examiner* — Taqi R Nasir
(74) *Attorney, Agent, or Firm* — Banner & Witcoff Ltd.

(57) ABSTRACT

In a computer-implemented method of training a machine learning based processor, the processor can be trained to derive image data from signal data sets of multiple spin echo sequences. The trained processor can be configured to perform image processing for Magnetic Resonance Imaging (MRI) to derive the image data.

20 Claims, 2 Drawing Sheets

(56) References Cited

OTHER PUBLICATIONS

Du, Jinglong et al. "Accelerated Super-resolution MR Image Reconstruction via a 3D Densely Connected Deep Convolutional Neural Network", IEEE International Conference on Bioinformatics and Biomedicine, pp. 349-355, 2018.

Nickel, Dominik "Joint processing of diffusion and TSE images" Nov. 5, 2018.

Huang, Junzhou et al. "Fast multi-contrast MRI reconstruction" Magnetic Resonance Imaging, vol. 32, No. 10, pp. 1344-1352, Dec. 2014.

Rundo, Leonardo et al. "USE-Net: Incorporating Squeeze-and-Excitation blocks into U-Net for prostate zonal segmentation of multi-institutional MRI datasets" Neurocomputing; vol. 365; pp. 31-43; Jul. 23, 2019 // ISSN: 0925-2312; DOI: 10.1016/J.NEUCOM.2019.07.006.

Ehrhardt, Matthias J. et al. "Joint reconstruction of PET-MRI by exploiting structural similarity" Inverse Problems, vol. 31, No. 1, 2015 // doi:10.1088/0266-5611/31/1/015001.

Chen, Feiyu et al. "Semi-Supervised Learning for Reconstructing Under-Sampled MR Scans" ISMRM—2019 Proceedings of the International Society for Magnetic Resonance in Medicine, 27th Annual Meeting and Exhibition; May 11-16, 2019 // Abstract No. 4649.

Gong, Enhao et al. "Improved Synthetic MRI from Multi-echo MRI Using Deep Learning" ISMRM—2018; Proceedings of the International Society for Magnetic Resonance in Medicine; 26th Annual Meeting and Exhibition; Jun. 16-21, 2018 // Abstract No. 2795.

European Extended Search Report dated Jul. 8, 2020, for Application No. 19200571.8.

Partial European Search Report dated Apr. 16, 2020, for Application No. 19200571.8.

\* cited by examiner

TRAINED IMAGE PROCESSING FOR DIFFUSION WEIGHTED IMAGING AND/OR TURBO SPIN ECHO SEQUENCES WITH FOCUS ON BODY APPLICATIONS

CROSS REFERENCE TO RELATED APPLICATIONS

This patent application claims priority to European Patent Application No. 19200571.8, filed Sep. 30, 2019, which is incorporated herein by reference in its entirety.

BACKGROUND

Field

The present disclosure relates to a computer-implemented method of training a machine learning based processor and a computer-implemented method of image processing for Magnetic Resonance Imaging (MRI) as well as respective computer programs, computer-readable media, data processing systems and an MRI system.

Related Art

In MRI patients are imaged with multiple pulse sequences that are each able to depict different tissue properties. These measurements are usually obtained with anisotropic resolution to avoid excessive scan times or even due to physical limitations. All acquisitions are typically reconstructed separately of each other and no additional information like the fact that the same anatomical structure is imaged by the different pulse sequences is usually taken into account.

Different MRI pulse sequences are typically acquired and reconstructed independently from each other. Furthermore, if high resolution in three dimensions (3D) is desired, two dimensional (2D) imaging sequences are sometimes repeated in different imaging planes (e.g. transversal and sagittal and coronal) or alternative imaging techniques have to be used (e.g. 3D spin echo sequence (SPACE) instead of a Turbo Spin Echo (TSE) sequence). In joint reconstruction multiple MRI pulse sequences or even an MR image and a PET image are reconstructed simultaneously. This allows sharing information about edges and contrast, making it possible to reduce the scan time or achieve higher spatial resolution of the images.

In contrast, segmentation algorithms that try to automatically estimate contours of organs, tumours or other structures usually only take images from a single pulse sequences into account.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure to solve or at least alleviate the problems of the state of the art and provide for a refined image quality by an improved image reconstruction. The disclosure is related to a computer-implemented method, including a method of image processing for MRI as well as respective computer programs, computer-readable media, data processing systems and an MRI system.

In one or more exemplary embodiments, instead of mutually independent image processing and reconstructions, different imaging sequences from the same subject are reconstructed simultaneously with the help of a trained processor like a Neural Network (NN), in particular a U-net. This allows for superior spatial resolution and higher signal-to-noise ratio. When a NN is used for super-resolution segmentation, a higher spatial resolution and a more reliable segmentation are achieved, as data from multiple image orientations is considered.

According to a first aspect of the present invention a computer-implemented method of training a machine learning based processor, preferably a NN and most preferably a U-net comprises the steps receiving a training set, receiving an associated set of ground truth image data, iteratively providing training signal data sets and iteratively adapting internal behaviour. In the step of receiving a training set, a training set of multiple training signal data sets of multiple spin echo sequences is received. In the step of receiving an associated set of ground truth image data, associated ground truth image data is received. In the step of iteratively providing the training signal data sets, the training signal data sets of the received training set are provided to the processor. In the step of iteratively adapting internal behaviour, the internal behaviour of the processor, preferably weights of the NN and most preferably weights of the U-net are adapted based on a comparison of image data derived by the processor based on the current provided training signal data set and a current internal behaviour of the processor with the associated ground truth image data.

According to a second aspect of the present invention a computer-implemented method of image processing for MRI with a trained machine learning based processor, preferably a trained NN and most preferably a trained U-net trained by means of the method according to the first aspect of the present invention, comprises the steps receiving signal data sets, providing the signal data sets and deriving image data. In the step of receiving signal data sets, signal data sets of multiple spin echo sequences corresponding to the multiple spin echo sequences of the method according to the first aspect of the present invention are received. In the step of providing the signal data sets, the signal data sets are provided as input to the trained processor. In the step of deriving image data, image data is derived from the provided signal data sets by means of the trained processor.

According to a third aspect of the present invention a computer program comprises instructions which, when the program is executed by a computer, cause the computer to carry out the steps of the method according to the first aspect of the present invention.

According to a fourth aspect of the present invention a computer-readable medium has stored thereon the computer program according to the third aspect of the present invention. In an exemplary embodiment, a non-transitory computer-readable storage medium includes an executable program stored thereon. When this program is executed by a computer, the computer is instructed to perform the method according to aspects (e.g. third aspect) of the disclosure.

According to a fifth aspect of the present disclosure a data processing system comprises means for carrying out the steps of the method according to the first aspect of the present disclosure.

According to a sixth aspect of the present disclosure a computer program comprises instructions which, when the program is executed by a computer, cause the computer to carry out the steps of the method according to the second aspect of the present disclosure.

According to a seventh aspect of the present disclosure a computer-readable medium has stored thereon the computer program according to the sixth aspect of the present disclosure. In an exemplary embodiment, a non-transitory computer-readable storage medium includes an executable program stored thereon. When this program is executed by a computer, the computer is instructed to perform the method according to aspects (e.g. sixth aspect) of the disclosure.

According to an eighth aspect of the present disclosure a data processing system comprises a trained processor, preferably a trained NN and most preferably a trained U-net trained by means of the method according to the first aspect of the present disclosure and means for carrying out the steps of the method according to the second aspect of the present disclosure.

According to a ninth aspect of the present disclosure an MRI system comprises the data processing system according the eighth aspect of the present disclosure.

In an exemplary embodiment, the machine learning based processor may be a data processing system like a computer or network or a software module executed on a data processing system. The processor is designed for machine learning, where the processor can be trained to derive data or predictions from input data. The training is based on training input data and associated ground truth data or labels, which are used to adjust the internal behaviour of the processor such that the derived data more accurately resembles the ground truth data.

In particular, Artificial Neural Networks (ANN) or simply NNs are systems, in particular computing systems, inspired by biological neural networks that constitute animal brains. NNs "learn" to perform tasks by considering (labelled) examples or training input data, generally without being designed with any task-specific rules. During an initial learning or training phase NNs automatically generate identifying characteristics from the (labelled) training input data.

NNs comprise a collection of connected nodes called artificial neurons, which loosely model the neurons in a biological brain. Each connection (synapses in the biological brain) can transmit a signal from one node to another. A node that receives a signal can process it and then signal to subsequent neurons connected to it. In common NN implementations, the signal at a connection between nodes is a real number (e.g. 0 . . . 1), and the output of each artificial neuron is computed by some non-linear function of the sum of its inputs (from other nodes). The connections between nodes are called "edges". The edges in NNs may each have a weight that is adjusted during training of the NNs. The weight increases or decreases the strength of the signal at the corresponding edge. Nodes may each have a threshold such that the signal is only sent if an aggregate signal exceeds that threshold. Typically, nodes are aggregated into layers. Different layers may perform different kinds of transformations on their inputs. Signals travel from a first layer or input layer to a last layer or output layer, possibly after traversing the layers multiple times.

In other words, an NN is a network of simple elements, the so called nodes or artificial neurons, which receive input data. After receiving input data the nodes change their internal state (activation) according to that input data, and produce output depending on the input data and activation. The network forms by connecting the output of certain nodes to the input of other nodes forming a directed, weighted graph. The weights as well as the functions that compute the activation of each node can be modified during the initial learning/training, which is governed by a learning rule or paradigm.

A node receiving an input from at least one predecessor neuron consists of the following components: an activation, the node's state, depending on a discrete time parameter, optionally a threshold, which stays fixed unless changed by a learning/training function, an activation function (e.g. hyperbolic tangent function, sigmoid function, softmax function, rectifier function etc.) that computes the new activation at a given time and the net input and an output function computing the output from the activation (often the output function is the identity function). An important characteristic of the activation function is that it provides a smooth transition as input values change, i.e. a small change in input produces a small change in output.

An input node has no predecessor but serves as input interface for the whole NN. Similarly an output node has no successor and thus serves as output interface of the whole NN. An NN consists of edges/connections, each edge transferring the output of a node (predecessor) to the input of another, succeeding node (successor). Additionally to the assigned weight an edge may have a bias term added to a total weighted sum of inputs to serve as a threshold to shift the activation function. The propagation function computes the input to the succeeding node (successor) from the outputs of preceding nodes (predecessors) and may include the bias value.

A learning or rather training rule or paradigm is an algorithm which modifies the parameters of a respective NN, in order for given input data to the NN to produce a favoured output. This training typically amounts to modifying the weights and thresholds of the variables within the NN. Given a specific task to solve and a class of functions, learning means using a set of observations to find the one function of the class of functions, which solves the task in some optimal sense. This entails defining a cost function such that for the optimal solution the cost or loss is minimal and no other solution has a cost less than the cost of the optimal solution. The cost function is an important concept in learning, as it is a measure of how far away a particular solution is from an optimal solution to the problem to be solved. Learning algorithms search through the solution space to find a function that has the smallest possible cost or loss. For applications where the solution is data dependent, the cost must necessarily be a function of the observations, otherwise the model would not relate to the data. It is frequently defined as a statistic to which only approximations can be made. It is possible to define an arbitrary cost function, however, a particular cost function may be used either because it has desirable properties (e.g. convexity) or because it arises naturally from a particular formulation of the problem.

An NN can be discriminatively trained with a standard backpropagation algorithm.

Backpropagation is a method to calculate the gradient of a loss function (produces the cost associated with a given state) with respect to the weights in the NN. The weight updates of backpropagation can be done via stochastic gradient descent. The choice of the cost function depends on factors such as the learning type (e.g. supervised, unsupervised, reinforcement etc.) and the activation function. Commonly, the activation function and cost function are the softmax function and cross-entropy function, respectively.

In other words, training an NN essentially means selecting one model from the set of allowed models (or, in a Bayesian framework, determining a distribution over the set of allowed models) that minimizes the cost or loss. Commonly some form of gradient descent is deployed, using backpropagation to compute the actual gradients. This is done by simply taking the derivative of the cost function with respect to the network parameters and then changing those parameters in a gradient-related direction. Backpropagation training algorithms fall into three categories: steepest descent (with variable learning rate and momentum, resilient backpropagation), quasi-Newton (Broyden-Fletcher-Goldfarb-Shanno, one step secant), Levenberg-Marquardt and conjugate gradient (Fletcher-Reeves update, Polak-Ribiére update, Powell-Beale restart, scaled conjugate gradient).

Common training paradigms include supervised learning, unsupervised learning and reinforcement learning. Supervised learning uses a set of example pairs and the aim is to find a function in the allowed class of functions that matches the examples. In other words, the mapping implied by the data is inferred; the cost function is related to the mismatch between the mapping of the NN and the data and it implicitly contains prior knowledge about the problem domain. The cost may be the mean-squared error, which tries to minimize the average squared error between the NN's output and a target value over all the example pairs. Minimizing this cost using gradient descent for the class of NNs called multilayer perceptrons (MLP), produces the backpropagation algorithm for training NNs. In unsupervised learning, some data is given and the cost function to be minimized that can be any function of the data and the NN's output. The cost function is dependent on the task and any a priori assumptions (e.g. implicit properties or parameters of the model, observed variables etc.). In reinforcement learning, data is usually not given, but generated by an agent's interactions with the environment. At each point in time the agent performs an action and the environment generates an observation and an instantaneous cost according to some (usually unknown) dynamics. The aim is to discover a policy for selecting actions that minimizes some measure of a long-term cost, e.g. the expected cumulative cost. The environment's dynamics and the long-term cost for each policy are usually unknown, but may also be estimated. The environment is commonly modelled as a Markov decision process (MDP) with states and actions with the following probability distributions: the instantaneous cost distribution, the observation distribution and the transition, while a policy is defined as the conditional distribution over actions given the observations. Taken together, the two then define a Markov chain (MC). The aim is to discover the policy (i.e., the MC) that minimizes the cost.

The U-net is a specific NN that comprises a convolutional network architecture for fast and precise segmentation of medical images. The architecture consists of a contracting path to capture context and a symmetric expanding path that enables precise localization. The U-net is trained by a training strategy that relies on the strong use of data augmentation to use available annotated samples more efficiently. A U-net can be trained end-to-end from very few images and outperforms conventional NNs.

Each training signal data set that is received includes multiple training signal data sets. Each training signal data set includes signal data corresponding to MR signals received during a respective MRI pulse sequence.

When placed in an external magnetic field $B_0$, individual nuclei or rather protons begin to precess at the Larmor frequency $$f_0 = \gamma B_0.$$

Each nucleus can be characterized by a wave function $\Psi$ that is a superposition of low-energy (spin-up) and high-energy (spin-down) states. At thermal equilibrium there is a tendency of the entire system (when viewed statistically) to prefer a distribution of slightly favouring the lower energy states. This results in a net magnetization M aligned with $B_0$. If the system is irradiated with energy from a transverse magnetic field ($B_1$) at the Larmor frequency, nuclear magnetic resonance will occur. The $B_1$ field is typically turned on for only a few ms [Millisecond] and is called a Radio Frequency pulse (RF-pulse). During stimulation into nuclear magnetic resonance, the spin system is rotated so that the net magnetization M, originally aligned with $B_0$, precesses around the $B_0$ direction and develops transverse components ($M_{xy}$). After the $B_1$ field is turned off, M continues to precess around $B_0$. A receiver coil (or rather multiple quadrature receiver coils) sensitive to magnetic flux changes in the transverse plane can then detect the $M_{xy}$ components as they oscillate at the Larmor frequency. A small current is generated in the receiver coil(s) via the Faraday-Lenz induction principle. The MR signal is a small electrical current induced in the receiver coil(s) by the precession of the net magnetization M during resonance.

Here, the signal data of the training signal sets is based on (equal or mutually different) spin echo sequences. A single RF-pulse generates a Free Induction Decay (FID), but two successive RF-pulses produce a spin echo. The time between the middle of the first RF-pulse and the peak of the spin echo is called the Echo Time (TE). For generation of a spin echo a first RF-pulse generates an FID, while a second or successive RF-pulse generates the spin echo. The TE is twice the interpulse interval. The spin echo represents regeneration of spin phase information apparently lost during the decay of the FID. The "rebirth" of the FID as a spin echo is possible because many T2* processes which originally produced the decay of the FID are symmetrically reversible. In other words, most of the FID signal has not been destroyed, but it has merely become "disorganized" because the individual spins comprising it have lost their phase coherence. The system is to possess a "hidden order" or "atomic memory". By applying a second RF pulse, certain dephased components of the original FID can be refocused into a spin echo. A so-called 90°-pulse first tips the spins into a transverse plane. Because local microscopic fields may differ slightly, some spin groups may precess faster (and gain phase) relative to others. A so-called 180°-pulse then turns or flips the entire system upside down. After the flip, the faster precessing spins now find themselves at the back of the pack. With continued evolution they eventually catch up with the slower spins. This occurs at the time $$TE = 2t$$

which is the centre of the spin echo. Beyond the echo centre the faster spins once again leave the slower ones behind and the system again dephases. In fact, spin echoes are formed when two successive RF-pulses of any flip angle are employed. When flip angles other than 90° and 180° are employed, the resultant spin echo is sometimes referred to as a Hahn echo.

The signal data of the training signal sets correspond to MR signals recorded with the receiver coil(s) of an MRI system during the spin echo sequences. As described above, the MR signal is an induced current generated by precession of the net magnetization M after stimulation by an RF-pulse. The signal is commonly detected in quadrature using receiver coils sensitive to magnetic flux in two orthogonal directions. Output channels of the orthogonal quadrature receiver coils, denoted I (for "in phase") and Q (for "quadrature"), provide for the received training signal data sets of the multiple spin echo sequences. Thereby, the quadrature receiver coils are measuring the same precessing magnetization M from two different perspectives. The signals in the I and Q channels are theoretically identical except for a 90°-phase shift between them. The second coil permits knowledge of the exact position of M and hence its direction of its rotation (i.e. positive vs negative frequency). In reality the signals from the I and Q channels are not phase-shifted exact copies of one another because they also contain noise. Unlike the signals, noise in the two channels is independent and uncorrelated. Thus quadrature detection offers an increase in Signal-to-Noise-Ratio (SNR) by a factor of √2=1.41 over detection by a single linear receiver coil.

The MR signal can be represented as a vector with Real (Re) and Imaginary (Im) components recorded from the I and Q channels respectively. An equivalent/alternative representation of the signal is as a complex number $$Signal = (Re, Im) = Re + iIm$$

where $i^2 = -1$, the imaginary unit. Its magnitude and phase can be calculated by simple trigonometry. The designation of the I and Q signal channels as "real" and "imaginary" is entirely arbitrary. The signal from one channel is no more or less "real" than that from the other channel. In conventional MRI the signal data may be reconstructed as a "real" image using only Re, as an "imaginary" image using only Im, as a magnitude image using the magnitude of the MR signal, or as a phase image using the phase of the MR signal. In clinical practice magnitude images are used nearly exclusively for diagnosis. Phase images are occasionally generated in clinical MRI for the depiction of flow and characterization of susceptibility-induced distortions.

Training signal data may be received from one or multiple MRI scanners. Thereby the training signal data may be obtained for one or multiple different subjects. Further, the training signal data may be obtained for one or multiple different organs, body parts or types of body tissue.

The ground truth image data is based on the associated training signal data set. Optionally, the ground truth image data may be based on more signal data than the training signal data in order to generate more refined image data as ground truth for the training of the processor. Further, the ground truth image data may be 2D or 3D image data.

A sub-set or all of the multiple training image data sets are provided one after another to the processor "under training" in order to iteratively improve the internal behaviour of the processor.

The internal behaviour of the processor, in particular the weights of the NN or U-net, are adapted iteratively. For each provided set of training image data, the processor generates current image data. This current image data is generated from the current training signal data, wherein the generation is based on the current internal behaviour (weights) of the processor (NN or U-net). The generated image data is compared to the ground truth image data associated with the current training signal data set. Based on the difference between the generated image data and the ground truth image data, the internal behaviour (weights) is adapted as described above in general. The adapting may be ended when the processor "converges", which means, when the difference between the generated image data and the ground truth image data is smaller than a predefined lower threshold. Then the processor is trained and can be used for generating high quality image data based on provided signal data sets.

In operation of the trained processor, signal data sets of multiple spin echo sequences are received. The received signal data sets have to be recorded during spin echo sequences that are equal to or at least correspond to the spin echo sequences used for recording the training signal data sets used in the training of the processor. Further, the received signal data sets have to be in the same format (e.g. real-valued signal, imaginary-valued signal, magnitude signal, complex-valued signal etc.) as the training signal data sets.

The received signal data sets are provided to the trained processor, in particular to the NN or U-net. The trained processor derives (2D or 3D) image data from the provided signal data sets based on its internal behaviour which is the result of the training according to the first aspect of the present disclosure as described above.

In the MRI system which may comprise an MRI scanner the signal data of one or more I and/or Q channels of the MRI scanner may directly be received at and provided to the trained processor, in particular NN or U-net. The trained processor derives the image data from the provided signal data (sets) as described above. The image data may be displayed to a user (e.g. radiologist or practitioner) by means of a monitor, print-out etc.

The trained processor (NN or U-net) provides for refined image data that offers higher resolution, improved organ segmentation and better depiction of physiological processes.

According to a refinement of the present disclosure, the multiple spin echo sequences all have the same sequence parameters.

The sequence parameters define the multiple spin echo sequences. The sequence parameters may include at least one of orientation in x, y, z-direction, resolution, b-value, diffusion direction, etc.

According to a refinement of the present disclosure, at least one of the multiple spin echo sequences has at least one different sequence parameter.

According to a refinement of the present disclosure, the training signal data sets comprise signal data of a 3D volume including signal data of multiple 2D slices.

The 2D slices of the 3D volume may be adjacent slices, where each slice may have a predefined slice thickness. Additionally, the (adjacent) slices may have a predefined spacing in between them.

According to a refinement of the present disclosure, the training signal data sets comprise real-valued signal data and additionally or alternatively complex-valued signal data.

The real-valued signal data may be magnitude signal data which is based on the magnitude of complex-valued signal data of the I channel(s) and/or Q channel(s) of an MRI scanner.

The real-valued signal data needs less storage capacity such that large amounts of different training signal data sets can be efficiently stored.

The complex-valued signal data contains more information (e.g. phase of the MR signal) that can be used by the processor to derive more precise and detailed image data. In particular signal dropouts and distortions are best addressed using a trained processor (NN, U-net) working on complex valued signal data.

According to a further refinement of the present disclosure, the method according to the first aspect of the present disclosure further comprises the additional steps receiving a further training set and iteratively providing supplemental data sets. In the step of receiving a further training set, a further training set of supplemental data sets of the multiple spin echo sequences including at least one of $B_0$-maps, reverted phase encoding directions and distortion information associated to the multiple training signal data sets is received. In the step of iteratively providing supplemental data sets, the supplemental data sets associated to the multiple training signal data sets are iteratively provided to the processor. In the step of adapting, the image data is derived by the processor based on the current provided training signal data set together with the associated supplemental data set and the current internal behaviour of the processor.

According to a further refinement of the present disclosure, the method according to the second aspect of the present disclosure comprises the additional steps additionally receiving supplemental data sets and providing the supplemental data sets. In the step of additionally receiving supplemental data sets, supplemental datasets of the multiple spin echo sequences corresponding to the multiple spin echo sequences of the method according to the first aspect of the present disclosure are received. The supplemental data sets include at least one of $B_0$-maps, reverted phase encoding directions and distortion information associated with the signal data sets. In the step of providing the supplemental data sets, the associated supplemental data sets are provided as input to the trained processor. The image data is derived from the provided signal data sets and from the associated supplemental data sets by the trained processor.

The $B_0$-maps contain information about the $B_0$ field which is not perfectly homogenous. This additional information can be used in addition to the signal data by the processor, in particular the NN or U-net, for deriving the image data.

The phase encoding direction gives the direction in which the phase of the spins was shifted by a phase encoding gradient. The phase encoding direction is associated with two major artefacts, wrap-around and flow/motion. Wrap-around (also called aliasing) occurs when the size of the body part imaged exceeds the defined field-of-view (FOV) in the phase encoding direction. This causes anatomy outside the FOV to be folded in over the main part of the image. Although methods exist to overcome this artefact (phase-oversampling) they require additional phase-encoding measurements to be made and hence incur an imaging time penalty. To avoid wrap-around the phase encoding direction is usually chosen to be along the shortest anatomic dimension. Flow and motion artefacts are also propagated predominantly in the phase-encode direction. Moving anatomic structures often producing problematic artefacts during MR imaging include the eyes, pharynx (swallowing), heart, lungs, diaphragm, and upper abdominal organs. The phase encoding direction is usually chosen so that these artefacts do not project over the area of interest. For example, axial brain images are usually phase-encoded from left to right so that artefacts from the eyes do not spill over into the brain. Artefacts from pulsatile blood flow behave in a similar fashion and are propagated along the phase-encoding axis. Arterial pulsations from the heart and aorta are particularly problematic, but flow artefacts may occur from any vessel, even large veins. Appropriate choice of phase- and frequency-encoding directions will not eliminate these artefacts but will move them off the area of interest. The reverted phase encoding directions can be used in addition to the signal data by the processor, in particular the NN or U-net, for diminishing such artefacts in the derived image data.

The distortion information as information additional to the signal data addresses deep learning dynamic field correction.

With the supplemental data sets of the further training set, the processor can derive more precise image data having more structural details and fewer artefacts.

According to a refinement of the present disclosure, the ground truth image data was generated based on more signal data than in the training signal data sets. Additionally or alternatively corrupted signal data was omitted for generating the ground truth image data.

The set of ground truth image data associated with the training input data sets of the trainings set may have been generated based not only on the associated training image data sets but additionally based on more signal data. Thereby, the quality of the ground truth image data can be increased (e.g. higher resolution, less artefacts, better contrast, more exact segmentation etc.).

As alternative or additional measure, corrupted signal data, which includes artefacts, distortions, motion etc. can have been (manually) dismissed and omitted for generation of the ground truth image data. In training the processor (NN or U-net), the corrupted signal data may still be used as training signal data (set).

With both measures, more signal data for generation of the ground truth image data than for training as well as omitting corrupted signal data in generation of the ground truth image data but not in training, increases the quality of the image data derived by the trained processor (NN or U-net).

According to a refinement of the present disclosure, at least one additional image processing step was performed in generating the ground truth image data.

In order to further improve the quality of the ground truth image data and, thus, the image data derived by the trained processor (NN or u-net), the at least one additional image processing step (e.g. image registration etc.) has been executed during generation of the ground truth image data.

According to a refinement of the present disclosure, at least a part of the training signal data sets was artificially augmented by expected effects.

In the part of the training signal data sets, the training signal data sets associated with at least one ground truth image data have been generated by artificially augmenting (distorting) an original training signal data set with at least one expected (adverse) effect or type of artefact like eddy currents, B0-inhomogenities, motion, incorrect phase correction etc. Thus, several different training signal data sets, that all are based on one original training signal data set that has been artificially augmented, are associated with the same ground truth image data.

Thereby, the amount of training signal data sets is increased and the processor (NN, U-net) is trained to cope with the expected adverse effects.

According to a refinement of the present disclosure, the training signal data sets were generated by downsampling at least a part of original signal data sets to a lower resolution. The ground truth image data was generated based on the original signal data sets. An output of the processor is adjusted to the resolution of the original signal data sets such that, in the step of adjusting, the image data is derived in the resolution of the original signal data sets by the processor.

With the signal data sets having downsampled resolution and the ground truth image data generated base on the original image data sets with high resolution, the processor (NN, U-net) is trained to derive image data with improved resolution compared to the resolution available from the provided input signal data (e.g. "super-resolution").

According to a refinement of the present disclosure, the multiple spin echo sequences are multiple Diffusion Weighted Imaging (DWI) sequences.

Modern DWI sequences all trace their origin to the pulsed gradient spin echo (PGSE) technique. Symmetric, strong diffusion-sensitizing gradients (DGs) are applied on either side of a 180°-pulse of a spin echo sequence. The phases of stationary spins are unaffected by the DG pair since any phase accumulation from the first gradient lobe is reversed by the second. Diffusing spins, however, move into different locations between the first and second lobes, falling out of phase and losing signal. Immediately following the second DG, an image acquisition is executed. This is typically an echo-planar sequence using rapidly oscillating phase and frequency gradients that generate multiple gradient echoes. Rapid image acquisition is generally required to minimize the effects of bulk motion (such as vascular pulsations) on the DW images. Also other acquisitions (such as fast spin echo) are possible.

To suppress chemical shift artefacts, all DWI sequences utilize some sort of fat suppression method. This may be a chemically-selective fat saturation pulse or a nonselective "STIR-like" inverting pulse applied immediately before the 90°-pulse. Alternatively, the 90°-pulse itself may be selectively tuned to excite water protons only. To suppress eddy currents and reduce spatial distortion artefacts a "twice-refocused" PGSE sequence may be used. This technique employs a second 180°-refocusing pulse just before the image acquisition module begins. A third common modification to reduce eddy current artefacts involves the use of bipolar (rather than unipolar) DG's.

The so called b-value is a user-selected parameter that defines gradient strength and duration. The b-value determines the degree of diffusion weighting. Typical b-values range from 0 s/mm$^2$ [Second per square Millimetre] to 4000 s/mm$^2$ and preferably from 0 s/mm$^2$ to 1000 s/mm$^2$.

To generate DW images and their associated maps, the following steps are executed: The DW pulse sequence is first run with the DG's turned off or set to a very low value. This generates a set of b0 ("b-zero") images (b-value equals 0 or nearly 0) that are T2-weighted and serve as a baseline for later calculated maps. For abdominal imaging, for example, b50 images are often obtained, the small but nonzero gradient amplitude helping to suppress signal in vessels. Then the DW sequence is run with the DG's turned on individually or in combination and at various strengths. This produces DW source images sensitized to diffusion in multiple different directions. Afterwards, DW source images are combined to produce a set of Trace DW images, the first-line images used for clinical diagnosis. Subsequently, an Apparent Diffusion Coefficient (ADC) map is calculated using the data from the b0 and source images. The ADC map is used to clarify abnormalities seen on the trace images. Finally, further advanced processing can be optionally performed, creating additional calculated image sets for analysis. These may include exponential ADC maps, fractional anisotropy images, principal diffusion direction maps, and fibre tracking maps.

DWI image data provides for information about diffusion or rather anisotropic diffusion in biological tissue. Therefore, a processor (NN, U-net) trained to derive image data from signal data sets generated with DWI sequences can generate image data containing information about the diffusion in the organ or body part depicted in the derived image data.

According to a further refinement of the present disclosure the multiple spin echo sequences additionally comprise at least one TSE sequence.

The training signal data sets based on the TSE sequence provide for additional structural information and may also provide for a higher resolution in combination with the associated DWI-based training input data sets. In other words, the TSE-based training signal data sets provide for a reference image for the associated DWI-based training signal data sets.

A trained processor (NN, U-net) which has been trained with DWI-based signal data sets and associated TSE-based training signal data sets can derive image data that has higher resolution and better structural delimitation based on provided signal data sets recorded during DWI sequences and during at least one TSE sequence.

According to a further refinement of the present disclosure the at least one TSE sequence provides for a higher resolution in the training signal data than the DWI sequences. The ground truth image data is provided in the higher resolution. The output of the processor is adjusted to the higher resolution such that, in the step of adjusting, the image data is derived in the higher resolution by the processor.

The training signal data (sets) that is based on the TSE sequence may, for example, have a higher resolution of 1 mm [Millimetre] compared to the training signal data (sets) that is based on the DWI sequences which may, for example, have a resolution of 2 mm. The TSE-based signal data provides for a higher resolution in the ground truth image data and thus also in the image data derived by the trained processor (NN, U-net). The ground truth image data has the same higher resolution as the TSE-based signal data.

The processor (NN, U-net) having been trained with the DWI-based training data sets having lower resolution and additionally with the associated TSE-based training signal data sets having higher resolution can derive image data of the same higher resolution as the TSE-based signal data provided to the trained processor although the provided associated DWI-based signal data has a lower resolution.

According to a further refinement of the present disclosure the multiple DWI sequences have same b-value or different b-values and have same diffusion direction or different diffusion directions.

For example, the DWI-based training signal data sets associated with one ground truth image data may have been recorded with DWI sequences having a different b-value and thus provide for more information about the strength of diffusion in the biological tissue. Additionally or alternatively the DWI-based training signal data sets associated with one ground truth image data may have been recorded with DWI sequences having different diffusion directions and thus provide for more information about the direction of diffusion in the biological tissue.

A processor (NN, U-net) trained with DWI-based training signal data sets recorded with DWI sequences having a different b-value and additionally or alternatively different diffusion directions can derive image data containing more information about the diffusion in the depicted organ or body part.

In case at least three different diffusion directions are considered in training the trained processor (NN, U-net) can derive image data with improved contrast based on trace weighting.

According to an alternative refinement of the present disclosure, the multiple spin echo sequences are multiple Turbo Spin Echo (TSE) sequences.

Turbo Spin Echo (TSE) imaging, also known as Fast Spin Echo (FSE) imaging are based on the RARE (Rapid Acquisition with Refocused Echoes) technique. The TSE sequence (illustrated above) resembles a conventional spin echo sequence in that it uses a series of 180°-refocusing pulses after a single 90°-pulse to generate a train of echoes. The TSE technique, however, changes the phase-encoding gradient for each of these echoes (a conventional multi-echo sequence collects all echoes in a train with the same phase encoding). As a result of changing the phase-encoding gradient between echoes, multiple lines of k-space (i.e., phase-encoding steps) can be acquired within a given repetition time (TR). The number of echoes acquired in a given TR interval is known as the echo train length (ETL) or turbo factor. The ETL typically ranges from 4 to 32 for routine imaging, but may exceed 200 for rapid imaging/echo planar techniques. When the number of slices is not the limiting factor, imaging time is inversely proportional to ETL. In addition to speed, TSE techniques offer other advantages. First, the significant time savings by scanning multiple lines of k-space may be used to lengthen TR, allowing more time for recovery of longitudinal magnetization and hence improved signal-to-noise. A higher number of phase-encoding steps may be used, allowing improvement in spatial resolution. Finally, susceptibility-induced signal losses are reduced, making TSE superior to conventional spin echo techniques for imaging the skull base and around metal objects.

A processor trained with training signal data sets that have been recorded with TSE sequences can derive image data with high resolution and good structural detail from provided TSE-based image data.

According to a further refinement of the present disclosure, the multiple TSE sequences have three different orientations.

The three different orientations may be linearly independent from each other (perpendicular to each other). For example the three training signal data sets associated with each ground truth image data used for training may have been recorded with TSE-sequences that have sagittal, coronal and transversal orientation.

A processor (NN, U-net) trained with training signal data sets that are based on TSE sequences with three different orientations for each ground truth image data can derive image data with very high structural preciseness based on input signal data that was recorded with TSE sequences having three different orientations.

According to a further refinement of the present disclosure the multiple TSE sequences have at least one orientation with shifts in in-plane or through-plane direction.

The in-plane and through-plane shifts are smaller than the corresponding resolution, i.e. smaller than the in-plane resolution for in-plane shifts and smaller than the slice thickness for through-plane shifts.

Repeating a TSE sequence several times with different through-plane shifts while the orientation is kept leads to separate 2D acquisitions with through-plane shifts as training input signal data. The training input signal data allows to generate a 3D volume as ground truth out of the separate 2D acquisitions with through-plane shifts. Thus, the NN is trained with the separate 2D acquisitions with through-plane shifts (and same orientation) as training input signal data and respective 3D volumes generated therefrom as ground truth data such that the completely trained NN derives 3D image data from separate 2D acquisitions with through-plane shifts as input data.

Alternatively, when acquiring TSE scans with different orientations, an in-plane shift is applied on one (or more) of these orientations. Accordingly, the NN is trained with the separate 2D acquisitions with in-plane shifts (and different orientations) as training input signal data and respective 3D volumes generated therefrom as ground truth data such that the completely trained NN derives 3D image data from separate 2D acquisitions with in-plane shifts as input data.

According to a further refinement of the present disclosure at least one TSE sequence in one of the three different orientations provides for a higher resolution in the training signal data than the TSE sequences in the remaining of the three different directions. The ground truth image data is provided in the higher resolution. An output of the processor is adjusted to the higher resolution such that, in the step of adjusting, the image data is derived in the higher resolution by the processor.

The processor (NN, U-net) is trained with training signal data sets where for each ground truth image data at least one of the three associated training signal data sets was recorded with a higher resolution than the remaining training signal data sets. The ground truth image data has the same higher resolution as the at least one training signal data set and the output of the processor has consequently also the same higher resolution.

After the processor (NN, U-net) has been trained to derive image data with higher resolution from TSE-based training signal data sets where only at least one of the training signal data sets has the same higher resolution, it can achieve "super-resolution" for image data based on signal data sets where only at least one signal data set has the same higher resolution.

According to a further refinement the multiple spin echo sequences additionally comprise at least one DWI sequence in one orientation.

The additional DWI-based signal data set provides for improved information about the different tissues depicted in the image data. Based thereon segmentation can be improved.

According to a further refinement of the present disclosure the ground truth image data was generated by a three dimensional (3D) turbo spin echo sequence.

A 3D TSE sequence like SPACE (Sampling Perfection with Application optimized Contrasts using different flip angle Evolution) provides for high quality 3D ground truth image data such that the processor (NN, U-net) trained with the ground truth image data can derive 3D image data from provided TSE-based signal data sets.

Figure 1:
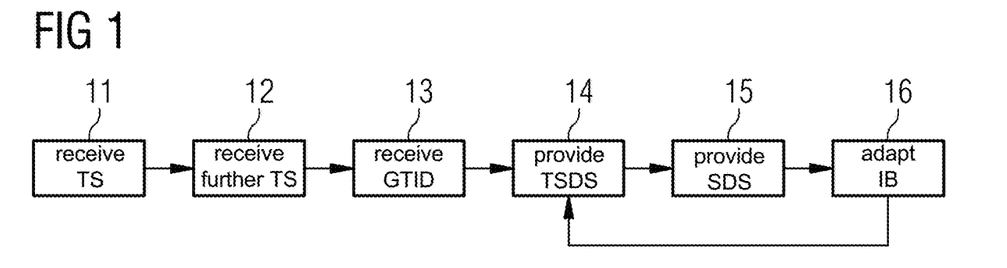
FIG. 1 is a flow chart of the computer-implemented method of training according to an exemplary embodiment of the present disclosure.

In FIG. 1, the computer-implemented method 10 of training according the first aspect of the present disclosure is schematically depicted. In an exemplary embodiment, the method 10 comprises the steps receiving 11 a training set, receiving 12 a further training set, receiving 13 an associated set of ground truth image data, iteratively providing 14 the training signal data sets, iteratively providing 15 the supplemental data sets and adapting 16 internal behaviour.

In the step of receiving 11 a training set, a training set of training signal data multiple training signal data sets of multiple spin echo sequences is received. The training signal data may have been recorded by quadrature receiver coils of an MRI scanner during the multiple spin echo sequences.

The received training signal data sets comprise signal data of a 3D volume including signal data of multiple 2D slices in real-valued and/or complex-valued form. At least a part of the training signal data sets may have been artificially augmented by expected effects (eddy currents, B0-inhomogenities, motion, incorrect phase correction etc.). Further at least a part of the training signal data sets may have been generated by downsampling a part of original signal data sets to a lower resolution.

The multiple spin echo sequences may be multiple DWI sequences optionally including at least one TSE sequence, in particular at least one TSE sequence with higher resolution than the DWI sequences, or multiple TSE sequences, preferably in three different orientations and most preferably with at least one TSE sequence in at least one of the orientations having a higher resolution than the remaining sequences or alternatively multiple TSE sequences having at least one orientation with shifts in in-plane or through-plane direction, further optionally including at least one DWI sequence. The multiple spin echo sequences either all have the same sequence parameters (orientation in x, y, z-direction, resolution, b-value, diffusion direction, etc.) or at least one of the multiple spin echo sequences has at least one different sequence parameter than the remaining multiple spin echo sequences. The DWI sequences have same b-value or different b-values and have same diffusion direction or different diffusion directions.

In the step of receiving 12 a further training set, a further training set associated with the training set is received. The further training set comprises supplemental data sets of the multiple spin echo sequences including at least one of $B_0$-maps, reverted phase encoding directions and distortion information associated to the multiple training signal data sets of the trainings set.

In the step of receiving 13 an associated set of ground truth image data, an associated set of ground truth image data is received. The ground truth image data was generated based on more signal data than in the training signal data sets and corrupted signal data was omitted for generating the ground truth image data. Further, the training signal data was used for generating the ground truth data before a part of the training signal data sets has been downsampled and before a part of the training signal data sets has been artificially augmented by expected effects.

Additionally, at least one additional image processing step (e.g. registration) was performed in generating the ground truth image data. The ground truth image data has the highest possible resolution from the available resolutions of the training input data sets.

The steps 14 to 16 are iteratively executed. In the step of iteratively providing 14 the training signal data sets, the training signal data sets of the training set are (randomly selected and) provided iteratively to the processor which is a U-net. Additionally, in the step of iteratively providing 15 the supplemental data sets, the supplemental data sets associated to the multiple training signal data sets are iteratively provided to the U-net. In the step of adapting 16 internal behaviour, the internal behaviour, namely weights of the U-net are adapted. Thereto current image data is derived by the U-net based on the current provided training signal data set together with the associated supplemental data set and the current weights of the U-net. The current image data is then compared with the associated ground truth image data and depending on the difference between the current image data and the associated ground truth image data the weights of the U-net are adapted and the method 10 continues with step 14 until a predefined lower threshold for the difference is met. The output of the U-net has the highest possible resolution like the ground truth image data.

The steps 11 to 16 of the method 10 correspond to the program steps of the computer program according to the third aspect of the present disclosure.

Figure 2:
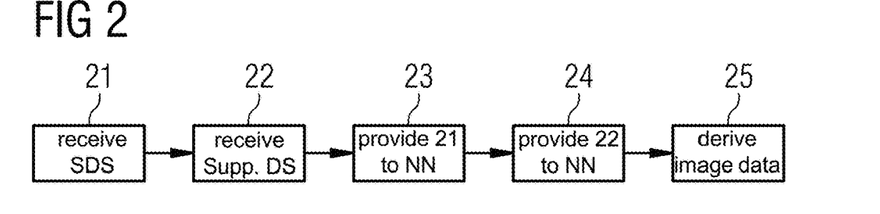
FIG. 2 is a flow chart of the computer-implemented method of image processing according to an exemplary embodiment of the present disclosure.

In FIG. 2 the computer-implemented method 20 of image processing for MRI with a trained U-net according to the second aspect of the present disclosure is schematically depicted. The trained U-net was trained by means of the method according to the first aspect of the present disclosure and as depicted in FIG. 1. The method 20 comprises the steps receiving 21 signal data sets, receiving 22 supplemental data sets, providing 23 the signal data sets, providing 24 the supplemental data sets and deriving 25 image data.

In the step of receiving 21 signal data sets, signal data sets are received. The received signal data sets have been recorded with multiple spin echo sequences corresponding to the multiple spin echo sequences of the method according to the first aspect of the present disclosure and as depicted in FIG. 1. Thus, the received signal data sets correspond to the training signal data sets regarding the generation of the recorded signals.

In the step of receiving 22 supplemental data sets, supplemental data sets are received. The supplemental data sets include at least one of $B_0$-maps, reverted phase encoding directions and distortion information associated with the signal data sets and are based on the multiple spin echo sequences corresponding to the multiple spin echo sequences of the method according to the first aspect of the present disclosure and as depicted in FIG. 1.

In the steps 23 and 24 the received image data sets and associated supplemental data sets are provided to the U-net.

In the step 25 of deriving image data, image data is derived from the provided signal data and from the associated supplemental data sets by means of the trained U-net. The derived image data corresponds to the ground truth training image data regarding quality and resolution.

The steps 21 to 25 of the method 20 correspond to the program steps of the computer program according to the sixth aspect of the present disclosure.

Figure 3:
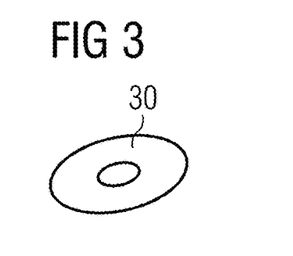
FIG. 3 is a schematic view of the computer-readable medium according to an exemplary embodiment of the present disclosure.

In FIG. 3 an embodiment of the computer-readable medium 30 according to the fourth aspect of the present disclosure is schematically depicted.

A computer-readable storage disc 30, such as a Compact Disc (CD), Digital Video Disc (DVD), High Definition DVD (HD DVD) or Blu-ray Disc (BD), has stored thereon the computer program according to the third aspect of the present disclosure and as schematically shown in FIG. 1. However, the computer-readable medium may also be a data storage like a magnetic storage/memory (e.g. magnetic-core memory, magnetic tape, magnetic card, magnet strip, magnet bubble storage, drum storage, hard disc drive, floppy disc or removable storage), an optical storage/memory (e.g. holographic memory, optical tape, Tesa tape, Laserdisc, Phasewriter (Phasewriter Dual, PD) or Ultra Density Optical (UDO)), a magneto-optical storage/memory (e.g. MiniDisc or Magneto-Optical Disk (MO-Disk)), a volatile semiconductor/solid state memory (e.g. Random Access Memory (RAM), Dynamic RAM (DRAM) or Static RAM (SRAM)), a non-volatile semiconductor/solid state memory (e.g. Read Only Memory (ROM), Programmable ROM (PROM), Erasable PROM (EPROM), Electrically EPROM (EEPROM), Flash-EEPROM (e.g. USB-Stick), Ferroelectric RAM (FRAM), Magnetoresistive RAM (MRAM) or Phase-change RAM).

Figure 4:
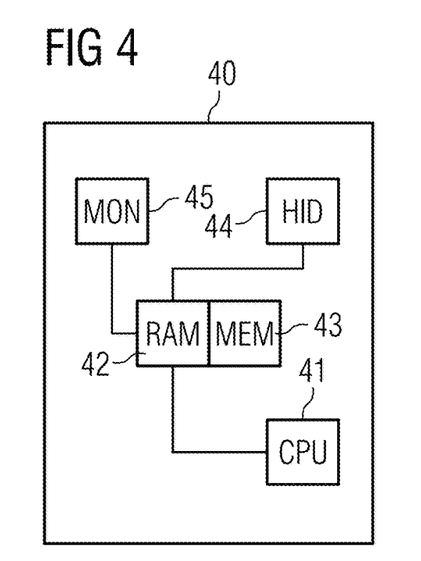
FIG. 4 is a data processing system according to an exemplary embodiment of the present disclosure.

In FIG. 4 an embodiment of the data processing system 40 according to the fifth aspect of the present disclosure is schematically depicted.

In an exemplary embodiment, the data processing system 40 may be a personal computer (PC), a laptop, a tablet, a server, a distributed system (e.g. cloud system) and the like. In an exemplary embodiment, the data processing system 40 comprises a central processing unit (CPU) 41, a memory having a random access memory (RAM) 42 and a non-volatile memory (MEM, e.g. hard disk) 43, a human interface device (HID, e.g. keyboard, mouse, touchscreen etc.) 44 and an output device (MON, e.g. monitor, printer, speaker, etc.) 45. The CPU (processor) 41, RAM 42, HID 44 and MON 45 are communicatively connected via a data bus. The RAM 42 and MEM 43 are communicatively connected via another data bus. The computer program according to the third aspect of the present disclosure and schematically depicted in FIG. 1 can be loaded into the RAM 42 from the MEM 43 or another computer-readable medium 30. According to the computer program the CPU 41 executes the steps 11 to 16 of the computer-implemented method according to the first aspect of the present disclosure and schematically depicted in FIG. 1. The execution can be initiated and controlled by a user via the HID 44. The status and/or result of the executed computer program may be indicated to the user by the MON 45. The result of the executed computer program may be permanently stored on the non-volatile MEM 43 or another computer-readable medium.

In particular, the CPU 41 and RAM 42 for executing the computer program may comprise several CPUs 41 and several RAMs 42 for example in a computation cluster or a cloud system.

The HID 44 and MON 45 for controlling execution of the computer program may be comprised by a different data processing system like a terminal communicatively connected to the data processing system 40 (e.g. cloud system).

In an exemplary embodiment, the data processing system 40 includes processor circuitry that is configured to perform one or more functions and/or operations of the data processing system 40. In these aspects, one or more of the sub-components of the data processing system 40 can include processor circuitry that is configured to perform respective functions and/or operations of the sub-component(s).

Figure 5:
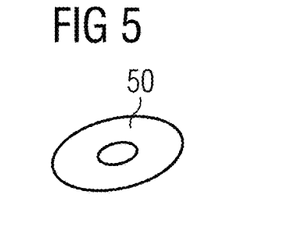
FIG. 5 is a schematic view of the computer-readable medium according to an exemplary embodiment of the present disclosure.

In FIG. 5 an embodiment of the computer-readable medium 50 according to the seventh aspect of the present disclosure is schematically depicted.

The computer-readable storage disc 50, such as a Compact Disc (CD), Digital Video Disc (DVD), High Definition DVD (HD DVD) or Blu-ray Disc (BD), has stored thereon the computer program according to the sixth aspect of the present disclosure and as schematically shown in FIG. 2. However, the computer-readable medium may also be a data storage like a magnetic storage/memory (e.g. magnetic-core memory, magnetic tape, magnetic card, magnet strip, magnet bubble storage, drum storage, hard disc drive, floppy disc or removable storage), an optical storage/memory (e.g. holographic memory, optical tape, Tesa tape, Laserdisc, Phasewriter (Phasewriter Dual, PD) or Ultra Density Optical (UDO)), a magneto-optical storage/memory (e.g. MiniDisc or Magneto-Optical Disk (MO-Disk)), a volatile semiconductor/solid state memory (e.g. Random Access Memory (RAM), Dynamic RAM (DRAM) or Static RAM (SRAM)), a non-volatile semiconductor/solid state memory (e.g. Read Only Memory (ROM), Programmable ROM (PROM), Erasable PROM (EPROM), Electrically EPROM (EEPROM), Flash-EEPROM (e.g. USB-Stick), Ferroelectric RAM (FRAM), Magnetoresistive RAM (MRAM) or Phase-change RAM).

Figure 6:
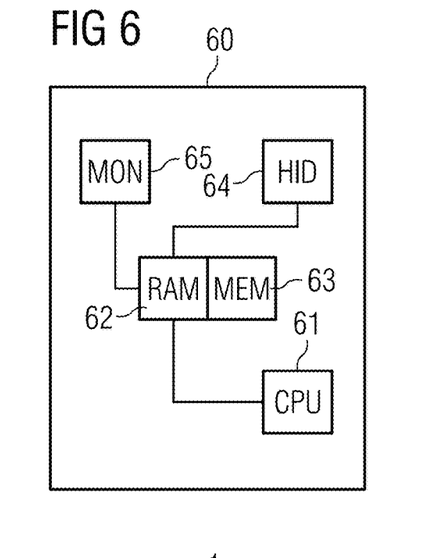
FIG. 6 is a data processing system according to an exemplary embodiment of the present disclosure.

In FIG. 6 an embodiment of the data processing system 60 according to the eighth aspect of the present disclosure is schematically depicted.

In an exemplary embodiment, the data processing system 60 may be a personal computer (PC), a laptop, a tablet, a server, a distributed system (e.g. cloud system) and the like. The data processing system 60 comprises a central processor (CPU) 61, a memory having a random access memory (RAM) 62 and a non-volatile memory (MEM, e.g. hard disk) 63, a human interface device (HID, e.g. keyboard, mouse, touchscreen etc.) 64 and an output device (MON, e.g. monitor, printer, speaker, etc.) 65. The CPU 61, RAM 62, HID 64 and MON 65 are communicatively connected via a data bus. The RAM 62 and MEM 63 are communicatively connected via another data bus. The computer program according to the sixth aspect of the present disclosure and schematically depicted in FIG. 2 can be loaded into the RAM 62 from the MEM 63 or another computer-readable medium 50. According to the computer program the CPU 61 executes the steps 21 to 25 of the computer-implemented method according to the second aspect of the present disclosure and schematically depicted in FIG. 2. The execution can be initiated and controlled by a user via the HID 64. The status and/or result of the executed computer program may be indicated to the user by the MON 65. The result of the executed computer program may be permanently stored on the non-volatile MEM 63 or another computer-readable medium. In an exemplary embodiment, the data processing system 60 includes processor circuitry that is configured to perform one or more functions and/or operations of the data processing system 60. In these aspects, one or more of the sub-components of the data processing system 60 can include processor circuitry that is configured to perform respective functions and/or operations of the sub-component(s).

In an exemplary embodiment, the processor, here the U-net, may be implemented on the data processing system 60 or on a separate data processing system like the data processing system 60 which is communicatively connected to the data processing system 60.

In particular, the CPU 61 and RAM 62 for executing the computer program may comprise several CPUs 61 and several RAMs 62 for example in a computation cluster or a cloud system. The HID 64 and MON 65 for controlling execution of the computer program may be comprised by a different data processing system like a terminal communicatively connected to the data processing system 60 (e.g. cloud system).

Figure 7:
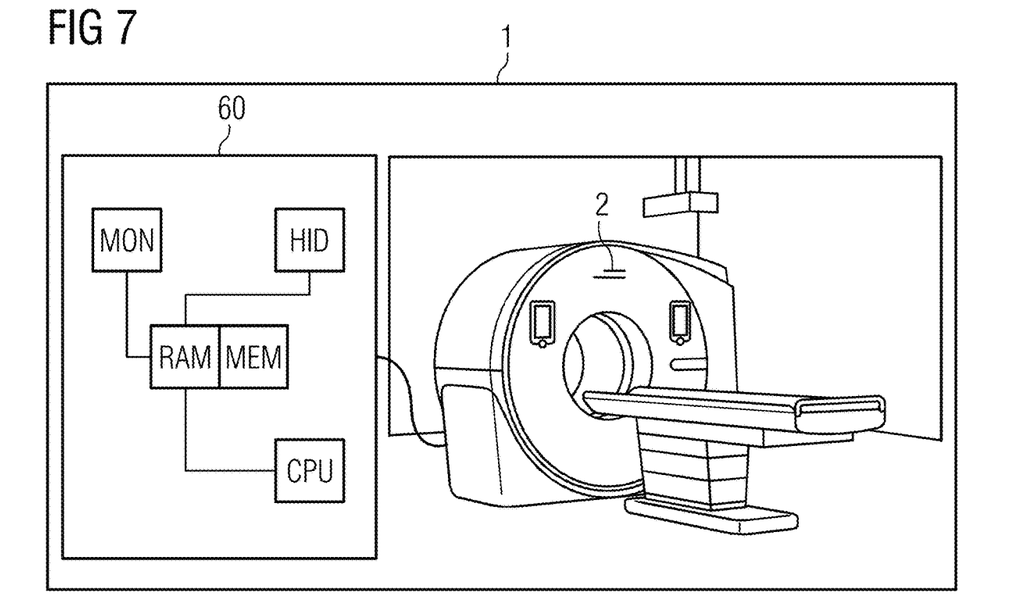
FIG. 7 is a MRI system according to an exemplary embodiment of the present disclosure.

In FIG. 7 the MRI system 1 according to the ninth aspect of the present disclosure is schematically depicted. In an exemplary embodiment, the MRI system 1 comprises the data processing system 60 and an MRI scanner 2. The data processing system 60 includes the trained U-net and is communicatively connected to a controller 8 (not depicted) of the MRI scanner 2. Signal data recorded by receiving coils (I and Q channels, not depicted) of the MRI scanner 2 during the above described spin echo sequences is provided to the data processing system 60.

Image data of high quality and resolution is derived from the provided signal data of the MRI scanner 2 by means of the trained U-net implemented on the data processing system 60.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples for the purpose of streamlining the disclosure. It is understood that the above description is intended to be illustrative, and not restrictive. It is intended to cover all alternatives, modifications and equivalents as may be included within the scope of the disclosure. Many other examples will be apparent to one skilled in the art upon reviewing the above specification.

Specific nomenclature used in the foregoing specification is used to provide a thorough understanding of the disclosure. However, it will be apparent to one skilled in the art in light of the specification provided herein that the specific details are not required in order to practice the disclosure. Thus, the foregoing descriptions of specific embodiments of the present disclosure are presented for purposes of illustration and description. They are not intended to be exhaustive or to limit the disclosure to the precise forms disclosed; obviously many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects. In the context of the present description and claims the conjunction "or" is to be understood as including ("and/or") and not exclusive ("either . . . or").

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A computer-implemented method of training a machine learning based processor, comprising:
   receiving a training set of multiple training signal data sets of multiple spin echo sequences;
   receiving an associated set of ground truth image data;
   iteratively providing the training signal data sets of the received training set to the processor; and
   iteratively adapting internal behaviour of the processor, including adapting weights of the machine learning based processor based on a comparison of: (a) image data derived by the processor based on a current one of the iteratively provided training signal data sets, and (b) a current internal behaviour of the processor with the associated ground truth image data.

2. The method according to claim 1, wherein the training signal data sets comprise signal data of a three dimensional (3D) volume including signal data of multiple two dimensional (2D) slices.

3. The method according to claim 1, wherein the training signal data sets comprise real-valued signal data and/or complex-valued signal data.

4. The method according to claim 1, further comprising:
   receiving a further training set of supplemental data sets of the multiple spin echo sequences including: $B_0$-maps, reverted phase encoding directions, and/or distortion information associated to the multiple training signal data sets; and
   iteratively providing the supplemental data sets associated to the multiple training signal data sets to the processor,
   wherein, in iteratively adapting the internal behaviour of the processor, the image data is derived by the processor based on the current provided training signal data set, the associated supplemental data set, and the current internal behaviour of the processor.

5. The method according to claim 1, wherein the ground truth image data has been generated based on more signal data than in the training signal data sets, and/or wherein corrupted signal data has been omitted for generating the ground truth image data.

6. The method according to claim 1, wherein at least one additional image processing step has been performed in generating the ground truth image data.

7. The method according to claim 1, wherein at least a portion of the training signal data sets has been artificially augmented by expected effects.

8. The method according to claim 1, wherein the training signal data sets have been generated by downsampling at least a portion of original signal data sets to a lower resolution, the ground truth image data having been generated based on the original signal data sets, wherein an output of the processor is adjusted to a resolution of the original signal data sets such that, in iteratively adapting the internal behaviour of the processor, the image data is derived in the resolution of the original signal data sets by the processor.

9. The method according to claim 1, wherein the multiple spin echo sequences are multiple Diffusion Weighted Imaging (DWI) sequences.

10. The method according to claim 9, wherein the multiple spin echo sequences additionally comprise at least one Turbo Spin Echo (TSE) sequence.

11. The method according to claim 10, wherein the at least one TSE sequence provides for a higher resolution in the training signal data than the DWI sequences, wherein:
    the ground truth image data is provided in the higher resolution, and
    the output of the processor is adjusted to the higher resolution such that, in iteratively adapting the internal behaviour of the processor, the image data is derived in the higher resolution by the processor.

12. The method according to claim 9, wherein the multiple DWI sequences have:
    a same b-value or different b-values, and
    a same diffusion direction or different diffusion directions.

13. The method according to claim 1, wherein the multiple spin echo sequences are multiple Turbo Spin Echo (TSE) sequences, and wherein the multiple TSE sequences have three different orientations.

14. The method according to claim 13, wherein:
    at least one TSE sequence in one of the three different orientations provides for a higher resolution in the training signal data than the TSE sequences in the remaining of the three different directions,
    the ground truth image data is provided in the higher resolution, and
    an output of the processor is adjusted to the higher resolution such that, in iteratively adapting the internal behaviour of the processor, the image data is derived in the higher resolution by the processor.

15. The method according to claim 13, wherein the multiple spin echo sequences additionally comprise at least one Diffusion Weighted Imaging (DWI) sequence in one orientation.

16. The method according to claim 13, wherein the ground truth image data has been generated by a three dimensional turbo spin echo sequence.

17. The method according to claim 1, wherein the machine learning based processor is a Neural Network (NN).

18. The method according to claim 1, wherein the machine learning based processor is a U-net convolutional neural network.

19. A data processing system comprising a trained processor, wherein the trained processor is trained based on the method of claim 1.

20. A computer-implemented method of image processing for Magnetic Resonance Imaging (MRI) with a trained machine learning based processor, comprising:
    receiving signal data sets of multiple spin echo sequences;
    in response to the trained processor having been trained by a training process including: receiving a training set of multiple training signal data sets of the multiple spin echo sequences, receiving an associated set of ground truth image data, iteratively providing the training signal data sets of the received training set to the processor, receiving a further training set of supplemental data sets of the multiple spin echo sequences including: $B_0$-maps, reverted phase encoding directions, and/or distortion information associated to the multiple training signal data sets, iteratively providing the supplemental data sets associated to the multiple training signal data sets to the processor, and iteratively adapting internal behaviour of the processor, including adapting weights of the machine learning based processor based on a comparison of: (a) image data derived by the processor based on a current one of the iteratively provided training signal data sets, (b) the associated supplemental data set, and (c) a current internal behaviour of the processor with the associated ground truth image data, additionally receiving supplemental data sets of the multiple spin echo sequences, the supplemental data sets including $B_0$-maps, reverted phase encoding directions, and/or distortion information associated with the signal data sets;

providing the signal data sets as input to the trained processor;

in response to the trained processor having been trained by the training process, providing the supplemental data sets as input to the trained processor; and deriving, using the trained processor, image data based on: (a) the provided signal data sets and, (b) in response to the trained processor having been trained by the training process, the associated supplemental data sets.

* * * * *